United States Patent [19]
Choi et al.

[11] Patent Number: 6,026,009
[45] Date of Patent: Feb. 15, 2000

[54] FERROELECTRIC MEMORY DEVICE INCREASING VOLTAGE ON A BIT LINE TO REMOVE DUMMY CELLS AND A REFERENCE VOLTAGE GENERATOR

[75] Inventors: Ja Moon Choi; Jae Whan Kim, both of Kyoungki-do, Rep. of Korea

[73] Assignee: Hyundai Electronics Industries Co., Ltd., Ichon, Rep. of Korea

[21] Appl. No.: 09/207,033

[22] Filed: Dec. 8, 1998

[30] Foreign Application Priority Data

Dec. 23, 1997 [KR] Rep. of Korea .................. 97-72821

[51] Int. Cl.[7] .................................................. G11C 11/22
[52] U.S. Cl. ...................................... 365/145; 365/149
[58] Field of Search .................................. 365/145, 149, 365/210

[56] References Cited

U.S. PATENT DOCUMENTS

| | | |
|---|---|---|
| 5,539,279 | 7/1996 | Takeuchi et al. . |
| 5,572,459 | 11/1996 | Wilson et al. . |
| 5,579,257 | 11/1996 | Tai . |
| 5,751,626 | 5/1998 | Seyyedy ............................. 365/145 |

Primary Examiner—Vu A. Le
Attorney, Agent, or Firm—Jacobson, Price, Holman & Stern, PLLC

[57] ABSTRACT

The present invention relates a ferroelectric memory device capable of increasing the life time of the ferroelectric memory devices, by removing a reference ferroelectric capacitors with a smaller chip size. According to the present invention, the ferroelectric memory device uses a power supply Vcc as an reference voltage and doesn't have a reference cell consisting of ferroelectric capacitors. A plate voltage generator according to the present invention provides a plurality of voltage levels to a plate electrode of the ferroelectric capacitor at a read operation in order to use a power supply Vcc as a reference voltage of the sense amplifier, in response to first and second control signals, wherein the plate voltage generating means provides to the plate electrode a first voltage level Vcc+α more than a power supply Vcc by an additional voltage level α and a second voltage level of the power supply Vcc, in this order, wherein the first voltage level is provided to the plate electrode before the sense amplifier is enabled, wherein the second voltage level is provided to the plate electrode after the sense amplifier is enabled to restor the cell data in the ferroelectric capacitor, and wherein the additional voltage level is selected in a range that the bit line voltage corresponding to the logic data "0" is less than the reference voltage Vcc at the read operation.

13 Claims, 6 Drawing Sheets

FERROELECTRIC MEMORY DEVICE INCREASING VOLTAGE ON A BIT LINE TO REMOVE DUMMY CELLS AND A REFERENCE VOLTAGE GENERATOR

BACKGROUND OF THE INVENTION

1. Field of the Invention

The present invention relates to a memory device storing information and, more particularly, to a ferroelectric memory device using a ferroelectric material as a dielectric film in a capacitor.

2. Description of Prior Art

Figure 1:
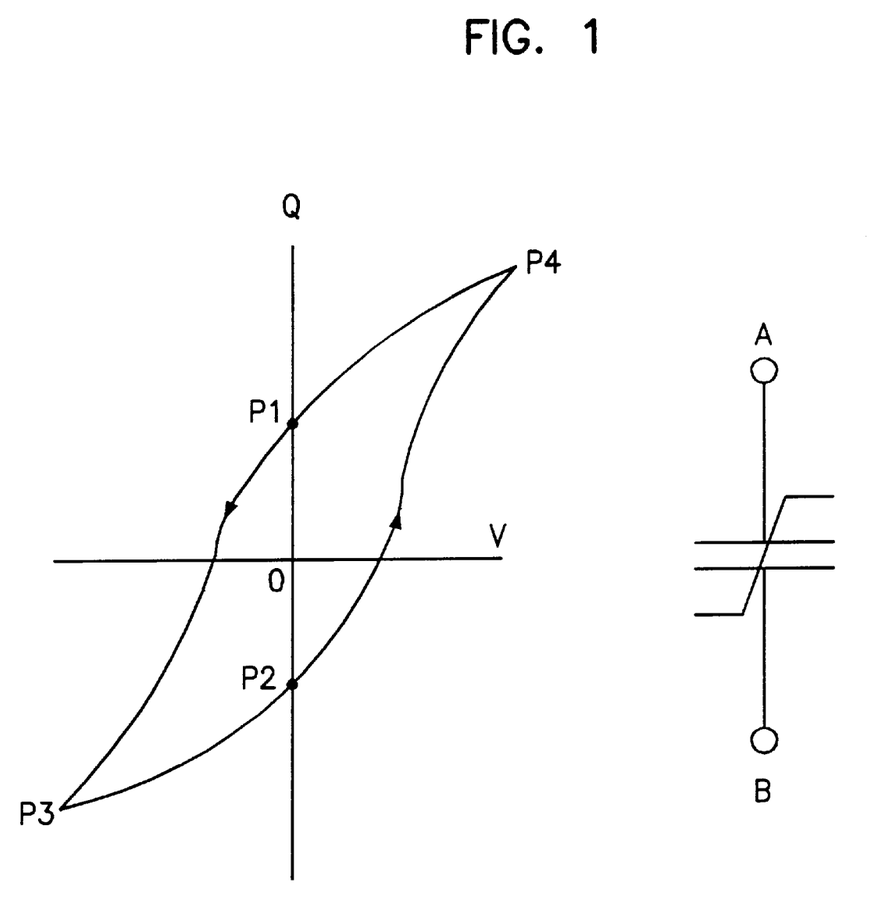
FIG. 1 shows a symbol of a ferroelectric capacitor and the hysteresis loop of polarization charge as a function of voltage therein.

Generally, a nonvolatile ferroelectric random access memory (NVFRAM), based on one-transistor and one-capacitor memory cell, has characteristics of fast access time and a small chip size. These characteristics result from a ferroelecric material used in the capacitor of the memory cell. FIG. 1 shows a symbol of a ferroelectric capacitor and the hysteresis loop thereof. That is, the polarization charge Q to voltage applied to the capacitor is shown in FIG. 1. In the ferroelectric capacitor, even if the voltage difference between two terminals of the capacitor is zero voltage, the charge Q may be one of two values of P1 and P2, and thus storing a binary data. Accordingly, based on these characteristics, the ferroelectric capacitor has been used in the nonvolatile memory device.

According to the variation of voltage applied to the both terminals of the ferroelectric capacitor, the stored charges therein vary with the degree of polarization of the ferroelectric material as shown in the hysteresis loop of FIG. 1. For example, when a large negative voltage of less than −3 V is applied to the capacitor having the polarization charge of P1, the polarization charges may reach P3 along the hysteresis loop. When the applied voltage is removed and then the voltage applied to the ferroelectric capacitor is zero voltage, the polarization charge may reach P2 again. That is, the polarization charges may vary along an arrow in the hysteresis loop in response to the applied voltage and the data is detected by the charges induced in the ferroelectric capacitor.

When the word line is activated during reading out the data stored in the ferroelectric memory, the potential on the bit line is in one of low or high voltage level, for example, V0 or V1, according to the stored data (logic "0" or "1"). Since the voltage levels of V0 and V1 are small signals, the voltage difference between these voltage levels should be amplified by a sense amplifier in similar to DRAM devices. Accordingly, to discriminate the low and high voltage level, it is required to provide an intermediate voltage level, i.e., a reference voltage level, to a bit bar line. By determining whether the voltage applied to the bit line is lower or higher than the reference voltage, the logic data "0" or "1" is determined.

Figure 2:
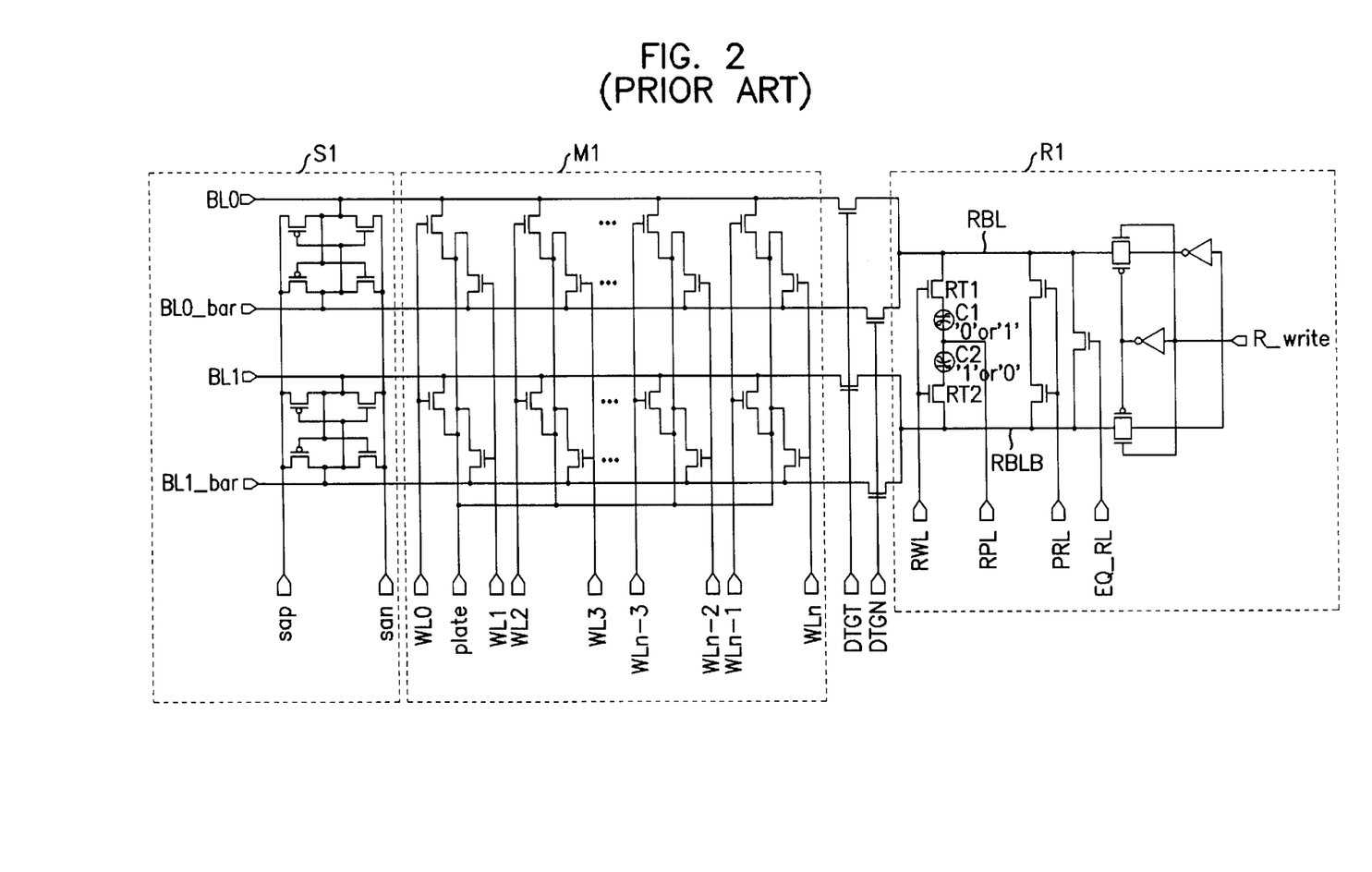
FIG. 2 is a circuit diagram illustrating a conventional NVFRAM.

FIG. 2 is a circuit diagram illustrating a conventional NVFRAM. In FIG. 2, reference numerals R1, M1, BL, /BL and S1 denote a reference voltage generator, a memory cell array for data storage, a bit line, a bit bar line and a sense amplifier, respectively. Reference cells C1 and C2 in the reference voltage generator R1 store a logic data "0" or "1" and switching transistors RT1 and RT2 are turned on under the control of the activated word line. After equalizing a reference bit line RBL having a charge $\Delta Q1$, which is induced by a reference cell, with a reference bit bar line /RBL having a charge $\Delta Q0$, which is induced by another reference cell, the equalized reference voltage is transferred to one of the bit line pair through a transfer transistor controlled by a control signal DTGT. It should be noted that the bit line coupled to the reference bit line is not electrically coupled to the ferroelectric cell in the memory array in order to be used as a reference voltage supply means. The one of the bit line pair is used as the reference voltage supply means and the other of the bit line pair is uses as a data path from the ferroelectric capacitor. In similar to DRAMs, the sense amplifier S1 senses the voltage difference between the bit line and the bit bar line.

In this conventional ferroelectric memory device including a plurality of memory arrays, because one reference voltage generator is repeatedly read out for a plurality of bit lines, the reference cells C1 and C2 are frequently used. That is, in case of the scheme in FIG. 2, the reference cells C1 and C2 are used N times as frequently as N memory cells. For example, assuming that 256 memory cells are provided in the memory array, the reference cells C1 and C2 must be read out even if any of 256 memory cells is selected. Based on the characteristics of ferroelectric material, the frequent reading operation causes the reference cells C1 and C2 to be fatigued. In particular, in case of this scheme in FIG. 2, the reference cells C1 and C2 are fatigued 256 times as fast as the ferroelectric capacitors in the memory array. This fatigue in the reference cells C1 and C2 may make the reference voltage incorrect, thereby causing an incorrect data reading operation.

SUMMARY OF THE INVENTION

It is an object of the present invention to provide a ferroelectric memory device capable of increasing the life time of the ferroelectric memory devices, by removing a reference ferroelectric capacitors.

It is another object of the present invention to provide a ferroelectric memory device having a smaller chip size.

According to the present invention, the ferroelectric memory device uses a power supply Vcc as an reference voltage and doesn't have a reference cell consisting of ferroelectric capacitors.

In accordance with an aspect of the present invention, there is provided a ferroelectric memory device including first and second bit lines to read out a cell data stored in a ferroelectric capacitor of a memory cell array, a precharging part to precharge the first and second bit lines, a sense amplifier amplifying a difference between the first and second bit lines and an equalizing part to equalize the first bit line with the second bit line, the device comprising: a plate voltage generating means for providing a plurality of voltage levels to a plate electrode of the ferroelectric capacitor at a read operation in order to use a power supply Vcc as a reference voltage of the sense amplifier, in response to first and second control signals, wherein the plate voltage generating means provides to the plate electrode a first voltage level Vcc+α more than a power supply Vcc by an additional voltage level α and a second voltage level of the power supply Vcc, in this order, wherein the first voltage level is provided to the plate electrode before the sense amplifier is enabled, wherein the second voltage level is provided to the plate electrode after the sense amplifier is enabled to restor the cell data in the ferroelectric capacitor, and wherein the additional voltage level is selected in a range that the bit line voltage corresponding to the logic data "0" is less than the reference voltage Vcc at the read operation.

In accordance with another aspect of the present invention, there is provided a ferroelectric memory device including first and second bit lines to read out a cell data stored in a ferroelectric capacitor of a memory cell array, a precharging part to precharge the first and second bit lines, a sense amplifier amplifying a difference between the first and second bit lines and an equalizing part to equalize the first bit line with the second bit line, the device comprising: a voltage generating means for selectively increasing a voltage level on a selected one of the first and second bit lines at a read operation in order that the voltage level on the selected bit line is higher than the power supply Vcc by an additional voltage and a voltage level on a nonselected bit line is lower than the power supply Vcc in response to a first control signal, wherein the sense amplifier senses and amplifies the voltage difference between the voltage level on the selected bit line and the power supply Vcc used as a reference voltage level, wherein the voltage generating means provides the power supply Vcc for the selected bit line in response to the first control signal and a second control signal to restor the cell data in the ferroelectric capacitor, and wherein the additional voltage level is selected in a range that the voltage on the selected bit line corresponding to the logic data "0" is less than the reference voltage Vcc at the read operation.

BRIEF DESCRIPTION OF THE DRAWINGS

This invention may be better understood and its object will become apparent to those skilled in the art by reference to accompanying drawings as follows.

DETAILED DESCRIPTION OF THE INVENTION

Hereinafter, a NVFRAM according to the present invention will be described below in detail referring the accompanying drawings.

Figure 3:
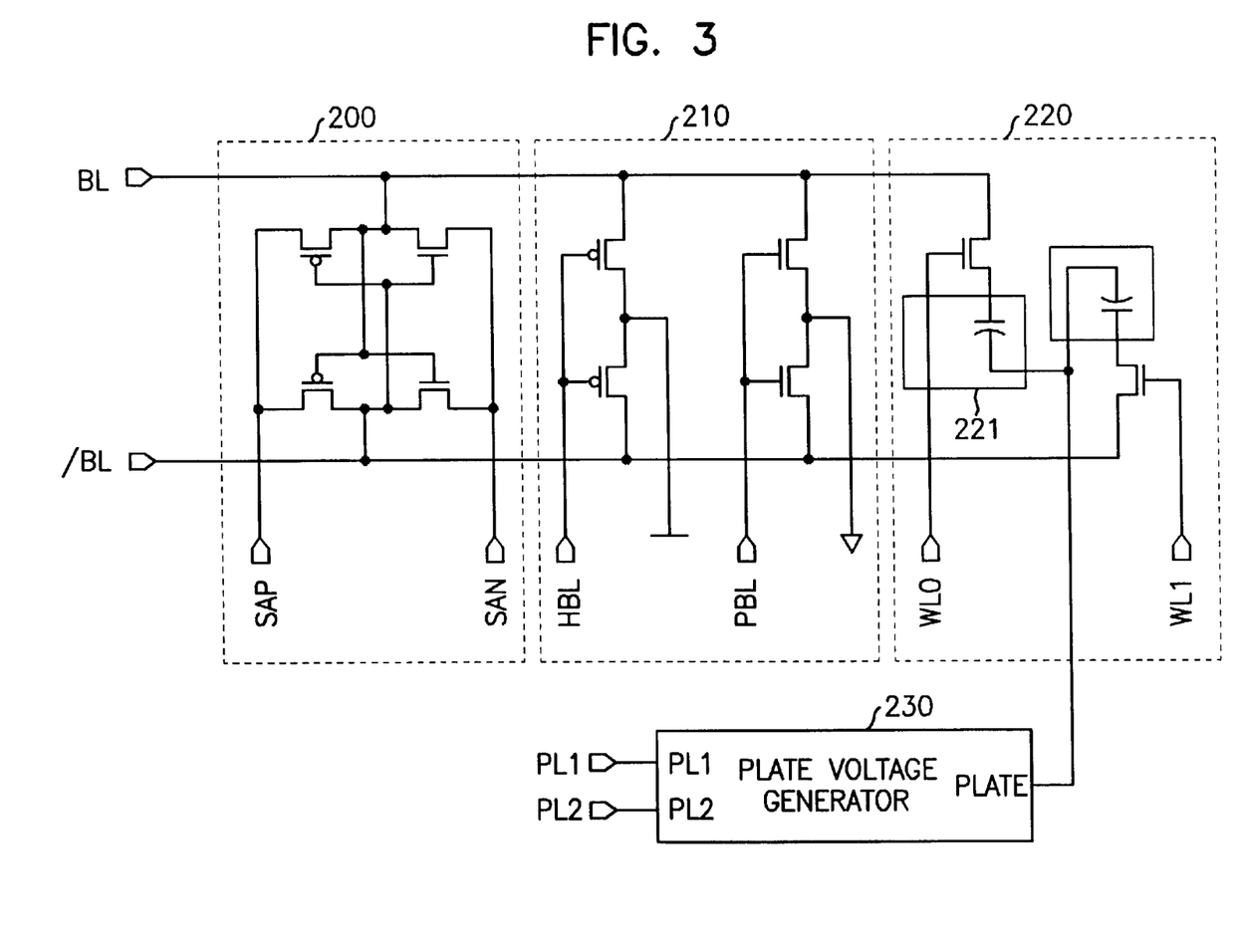
FIG. 3 is a circuit diagram illustrating a ferroelectric memory device according to the present invention.

Referring now to FIG. 3, a NVFRAM according to the present invention includes a memory cell 220, a precharge part 210 for precharging or equalizing bit lines BL and /BL, a sense amplifier for amplifying a voltage difference between the bit line BL and the bit bar line /BL and a plate voltage generator 230 for generating a plate voltage which is applied to the cell capacitor.

Figure 4:
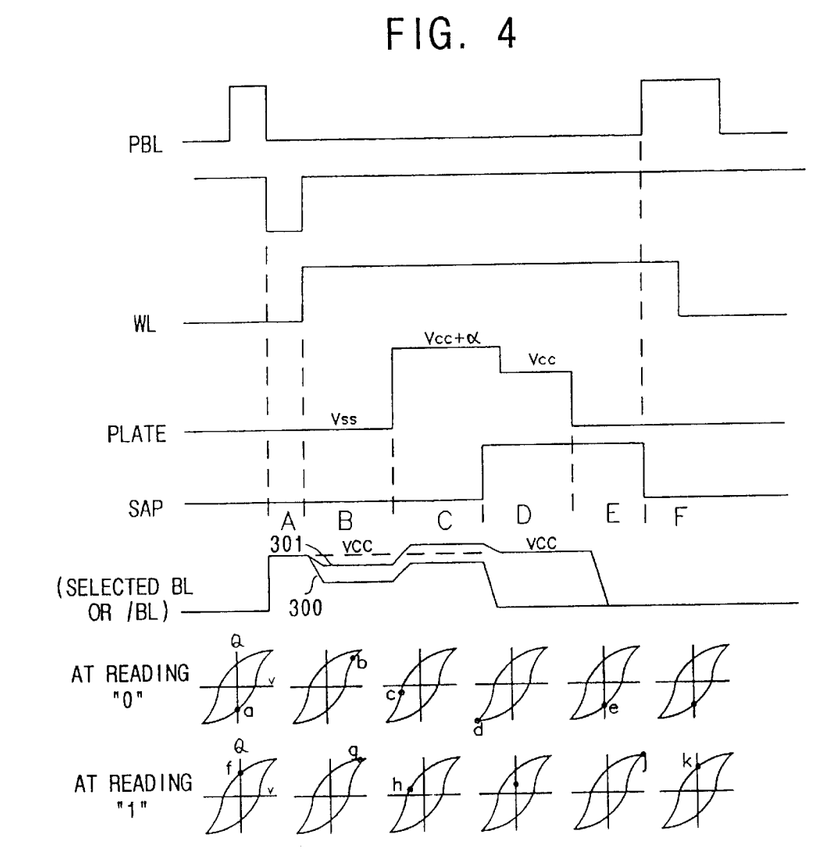
FIG. 4 is a timing chart of FIG. 3.

FIG. 4 is a timing chart of FIG. 3, showing the Q–V characteristic graph corresponding to each state. Referring to FIGS. 3 and 4, the read operation will be describe in detail. In a standby state, a bit line precharge signal PBL is activated in a high voltage level so that the bit lines BL and /BL are precharged to a ground voltage level. Next, in section A in FIG. 4, a high bit line precharge signal HBL is activated in a low voltage level so that the bit lines BL and /BL are precharged to a power supply Vcc.

In section B in FIG. 4 , a word line signal, for example, WL0, is activated in a high voltage level, thereby applying a high voltage to both terminal of the ferroelectric capacitor in a memory cell array. In case where data "0" is read out, the polarization charge Q moves from "a" to "b", and in case where data "1" is read out, the polarization charge Q moves from "f" to "g". Also, the bit line BL, which is selected by the word line WL0, may have a lower voltage level than the originally precharged voltage Vcc (reference numeral 300 in case of data "0" and reference numeral 301 in case of data "1") because of the charge sharing with the ferroelectric capacitor. On the other hand, the plate voltage is a ground voltage of Vss and the nonselected bit bar line /BL maintains the supply voltage Vcc as a reference voltage provided by the precharging part 210.

In section C in FIG. 4, the plate voltage Vcc+α from the plate voltage generator 230 is applied to the ferroelectric capacitor in the memory cell, thereby providing potential to both terminals of the ferroelectric capacitor. At this time, in the Q–V characteristic graph, in case where data "0" is read out, the polarization charge Q moves from "b" to "c", and in case where data "1" is read out, the polarization charge Q moves from "g" to "h". As shown in section C, in case where data "0" is read out, the voltage on the bit line BL is lower than the supply voltage Vcc and in case where data "1" is read out, it is higher than the supply voltage Vcc. The additional voltage of α must be controlled in a range that the bit line voltage corresponding to the logic data "0" is less than the reference voltage (i.e., Vcc).

In section D in FIG. 4, the sense amplifier is driven in response to a control signal SAP so that it amplifies the voltage difference between the bit line (having lower or higher voltage than the supply voltage Vcc) and the bit bar line (the reference voltage Vcc). In this section, the voltage on the bit line is set to the supply voltage Vcc in case of logic data "1" and the voltage on the bit line is set to the ground voltage Vss in case of logic data "0". To keep the information stored in the ferroelectric capacitor, the plate voltage is set to the supply voltage Vcc during the sensing operation. That is, in case where data "0" is read out, the polarization charge Q moves from "c" to "d", and in case where data "1" is read out, the polarization charge Q moves from "h" to "i".

In section E in FIG. 4, the plate voltage is set to the ground voltage Vss. Accordingly, in case where data "0" is read out, the polarization charge Q moves from "d" to "e", and in case where data "1" is read out, the polarization charge Q moves from "i" to "j".

In section F in FIG. 4, in a state that the word line WL0 is in a high level, the low-to-high logic transition is achieved at the bit line precharge signal PBL so that the polarization charge Q moves from "j" to "k", being the same as the initial polarization charge Q ("f").

Figure 5:
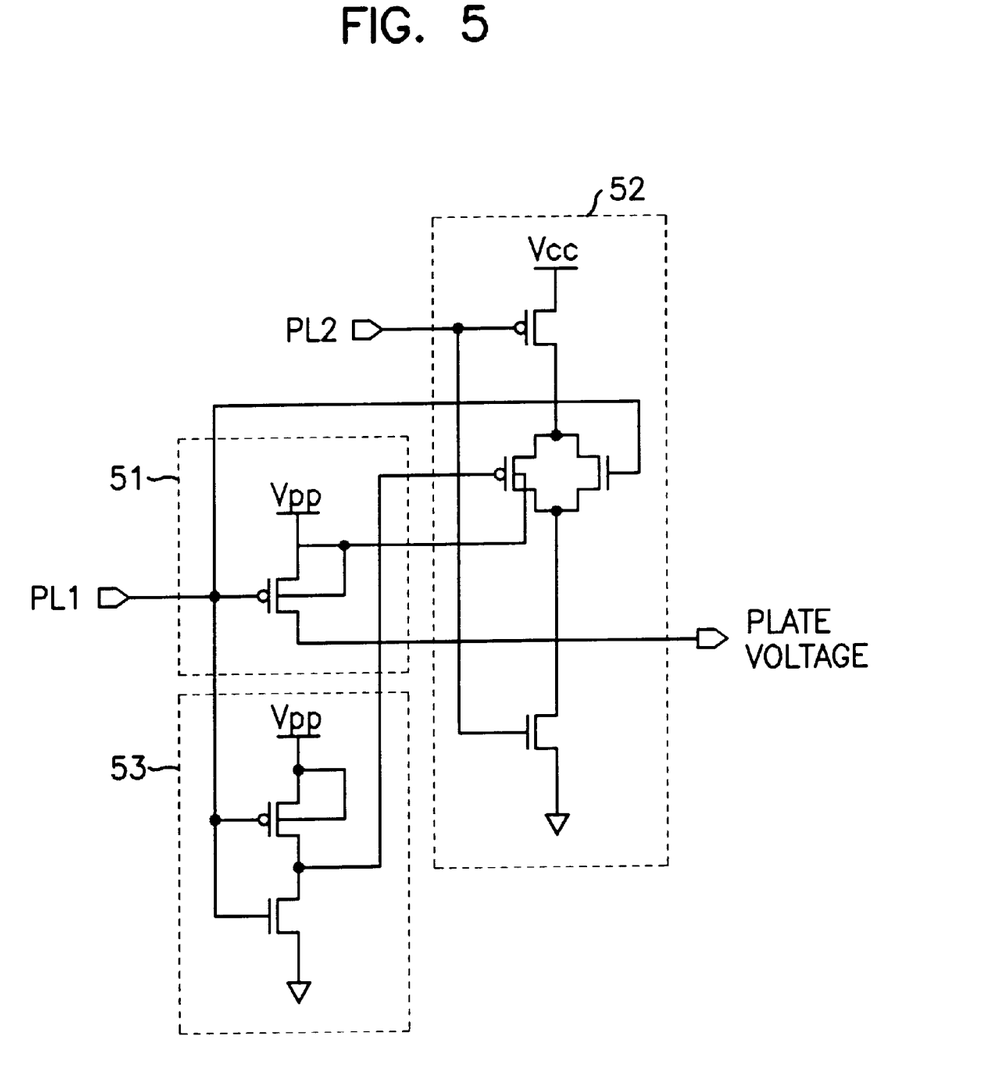
FIG. 5 is a circuit diagram of a plate voltage generator in FIG. 3.
Figure 6:
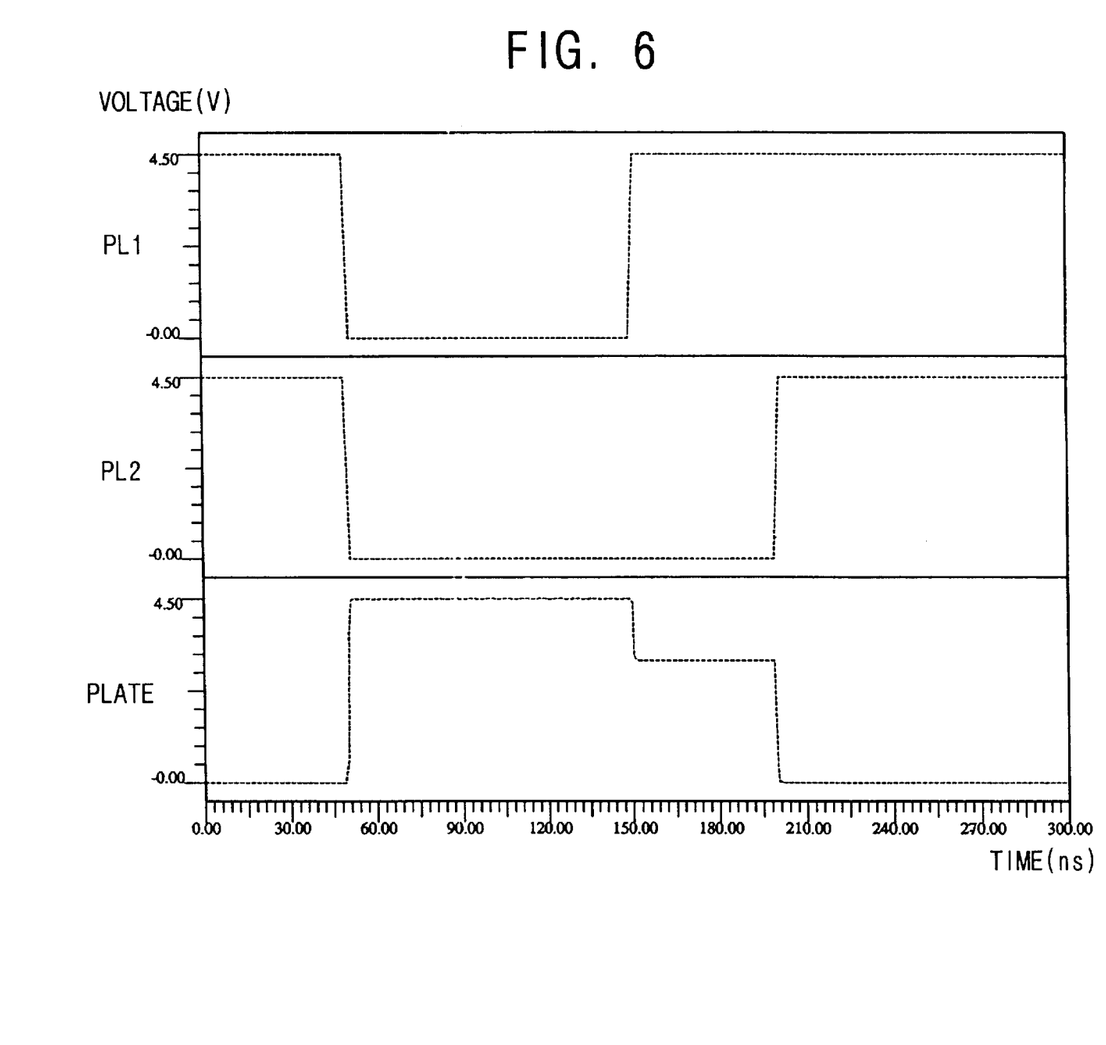
FIG. 6 is a timing chart of FIG. 5.

FIG. 5 is a circuit diagram of a plate voltage generator in FIG. 3 and FIG. 6 is a timing chart of FIG. 5. Referring now to FIG. 5, the plate voltage generator includes a first voltage generator 51 for providing the first voltage level (Vcc+α) for the plate electrode in response to a first control signal, a second voltage generator 52 for providing the second voltage level (Vcc) for the plate electrode in response to the first and second control signals and a control means 53 for controlling an output from the second voltage generator 52 in response to the first control signal.

The plate voltage generator receives two control signal PL1 and PL2. First, when the control signals PL1 and PL2 are all in a high voltage level, the PMOS transistors P314, P320 and P321 are turned off so that the plate voltage is 0 V. On the other hand, when the control signals PL1 and PL2 are all in a low voltage level, the PMOS transistors P314, P320 and P321 are turned on and a PMOS transistor P315 and an NMOS transistor N316 are turned off so that the plate voltage is Vpp (=Vcc+α). After a predetermined time, the low-to-high logic transition is achieved at the control signal PL1 so that the PMOS transistors P320 and P321 are turned off and the PMOS transistor P315 and the NMOS transistor N316 are turned on, thereby producing the plate voltage of Vcc. The control signals PL1 and PL2 can be implemented by using the high bit line precharge signal HBL, which is well-known to those skilled in the art to which the subject pertains.

As apparent from the above, the ferroelectric memory device according to the present invention doesn't need a reference voltage generator including a dummy cells which is made of ferroelectric capacitors. Accordingly, the ferroelectric memory device according to the present invention increases its life time and minimizes a chip size.

Although the preferred embodiments of the invention have been disclosed for illustrative purposes, those skilled in the art will appreciate that various modifications, additions and substitutions are possible, without departing from the scope and spirit of the invention as disclosed in the accompanying claims. For example, a voltage generator is substituted for the plate voltage generator, increasing voltage on a selected bit line, while a reference voltage of Vcc is applied to a nonselected bit line coupled to the sense amplifier.

What is claimed is:

1. A ferroelectric memory device including first and second bit lines to read out a cell data stored in a ferroelectric capacitor of a memory cell array, a precharging part to precharge the first and second bit lines, a sense amplifier amplifying a difference between the first and second bit lines and an equalizing part to equalize the first bit line with the second bit line, the device comprising:

a plate voltage generating means for providing a plurality of voltage levels to a plate electrode of the ferroelectric capacitor at a read operation in order to use a power supply Vcc as a reference voltage of the sense amplifier, in response to first and second control signals, wherein the plate voltage generating means provides to the plate electrode a first voltage level Vcc+α more than a power supply Vcc by an additional voltage level α and a second voltage level of the power supply Vcc, in this order, wherein the first voltage level is provided to the plate electrode before the sense amplifier is enabled, wherein the second voltage level is provided to the plate electrode after the sense amplifier is enabled to restor the cell data in the ferroelectric capacitor, and wherein the additional voltage level is selected in a range that the bit line voltage corresponding to the logic data "0" is less than the reference voltage Vcc at the read operation.

2. The ferroelectric memory device in accordance with claim 1, wherein the plate voltage generating means generates the first voltage level when the first and second signals are in a low voltage level.

3. The ferroelectric memory device in accordance with claim 2, wherein the plate voltage generating means generates the second voltage level when the first signals is in a high voltage level and the second signals is in a low voltage level.

4. The ferroelectric memory device in accordance with claim 3, wherein the plate voltage generating means comprises:

a first voltage generator for providing the first voltage level for the plate electrode in response to the first control signal;

a second voltage generator for providing the second voltage level for the plate electrode in response to the first and second control signals; and a control means for controlling an output from the second voltage generator in response to the first control signal.

5. The ferroelectric memory device in accordance with claim 4, wherein the first voltage generator comprises a pull-up means for providing the first voltage level.

6. The ferroelectric memory device in accordance with claim 5, wherein the control means comprises an inverter to generate an internal control signal to control the second voltage generator.

7. The ferroelectric memory device in accordance with claim 5, wherein the second voltage generator comprises:

a first PMOS transistor, a second PMOS transistor and a first NMOS which are coupled to each other in series; and a second NMOS transistor coupled to the second PMOS transistor in parallel, wherein the first PMOS transistor is responsive to the second control signal, the second PMOS transistor is responsive to an output from the control means, the first NMOS transistor is responsive to the second control signal and the second NMOS transistor is responsive to the first control signal.

8. The ferroelectric memory device in accordance with claim 7, wherein the pull-up means is a PMOS transistor.

9. A ferroelectric memory device including first and second bit lines to read out a cell data stored in a ferroelectric capacitor of a memory cell array, a precharging part to precharge the first and second bit lines, a sense amplifier amplifying a difference between the first and second bit lines and an equalizing part to equalize the first bit line with the second bit line, the device comprising:

a voltage generating means for selectively increasing a voltage level on a selected one of the first and second bit lines at a read operation in order that the voltage level on the selected bit line is higher than the power supply Vcc by an additional voltage and a voltage level on a nonselected bit line is lower than the power supply Vcc in response to a first control signal, wherein the sense amplifier senses and amplifies the voltage difference between the voltage level on the selected bit line and the power supply Vcc used as a reference voltage level, wherein the voltage generating means provides the power supply Vcc for the selected bit line in response to the first control signal and a second control signal to restor the cell data in the ferroelectric capacitor, and wherein the additional voltage level is selected in a range that the voltage on the selected bit line corresponding to the logic data "0" is less than the reference voltage Vcc at the read operation.

10. The ferroelectric memory device in accordance with claim 9, wherein the voltage generating means comprises:

a first voltage generator for providing a first voltage level higher than the power supply Vcc for the plate electrode in response to the first control signal;

a second voltage generator for providing the second voltage level, which is the same as the power supply Vcc for the plate electrode in response to the first and second control signals; and a control means for controlling an output from the second voltage generator in response to the first control signal.

11. The ferroelectric memory device in accordance with claim 10, wherein the first voltage generator comprises a pull-up means for providing the first voltage level.

12. The ferroelectric memory device in accordance with claim 11, wherein the control means comprises an inverter to generate an internal control signal to control the second voltage generator.

13. The ferroelectric memory device in accordance with claim 11, wherein the second voltage generator comprises:
   a first PMOS transistor, a second PMOS transistor and a first NMOS which are coupled to each other in series; and
   a second NMOS transistor coupled to the second PMOS transistor in parallel, wherein the first PMOS transistor is responsive to the second control signal, the second PMOS transistor is responsive to an output from the control means, the first NMOS transistor is responsive to the second control signal and the second NMOS transistor is responsive to the first control signal.

* * * * *